United States Patent
Ishihara et al.

(10) Patent No.: US 10,062,551 B2
(45) Date of Patent: Aug. 28, 2018

(54) SPUTTERING APPARATUS AND SUBSTRATE PROCESSING APPARATUS

(71) Applicant: CANON ANELVA CORPORATION, Kawasaki-shi, Kanagawa-ken (JP)

(72) Inventors: Shigenori Ishihara, Tokyo (JP); Kazuya Konaga, Kawasaki (JP); Hiroyuki Toya, Hachioji (JP); Shintaro Suda, Kawasaki (JP); Yasushi Yasumatsu, Inagi (JP); Yuu Fujimoto, Hino (JP); Toshikazu Nakazawa, Saitama (JP); Eiji Nakamura, Machida (JP); Shin Imai, Kawasaki (JP)

(73) Assignee: CANON ANELVA CORPORATION, Kawasaki-shi, Kanagawa-ken (JP)

( * ) Notice: Subject to any disclaimer, the term of this patent is extended or adjusted under 35 U.S.C. 154(b) by 215 days.

(21) Appl. No.: 14/724,319

(22) Filed: May 28, 2015

(65) Prior Publication Data
US 2015/0262796 A1 Sep. 17, 2015

Related U.S. Application Data

(63) Continuation of application No. PCT/JP2013/004975, filed on Aug. 23, 2013.

(30) Foreign Application Priority Data

Nov. 30, 2012 (JP) .................................. 2012-263648

(51) Int. Cl.
*C23C 14/34* (2006.01)
*H01J 37/34* (2006.01)
*C23C 14/35* (2006.01)
*H01J 37/32* (2006.01)

(52) U.S. Cl.
CPC ........ *H01J 37/3417* (2013.01); *C23C 14/352* (2013.01); *H01J 37/32715* (2013.01);
(Continued)

(58) Field of Classification Search
CPC .......................... H01J 37/3435; H01J 37/3447
See application file for complete search history.

(56) References Cited

U.S. PATENT DOCUMENTS

| 7,955,480 B2 | 6/2011 | Endo et al. |
| 8,900,426 B2 | 12/2014 | Nomura et al. |

(Continued)

FOREIGN PATENT DOCUMENTS

| CN | 101855381 A | 10/2010 |
| JP | 62-074072 A | 4/1987 |

(Continued)

OTHER PUBLICATIONS

Office Action (Notification of the First Office Action) dated Mar. 17, 2016, by the State Intellectual Property Office of the People's Republic of China) in corresponding Chinese Patent Application No. 201380062362.7, and an English Translation of the Office Action. (13 pages).

(Continued)

*Primary Examiner* — Jason Berman
(74) *Attorney, Agent, or Firm* — Buchanan Ingersoll & Rooney PC

(57) ABSTRACT

A sputtering apparatus includes a chamber, a substrate holder, first to fourth target holders, a shutter unit, and a gate valve through which the substrate is conveyed. The first to fourth target holders are arranged on vertices of a virtual rectangle having long sides and short sides and inscribed in a virtual circle centered on the axis, the first target holder and the second target holder are respectively arranged on two vertices defining one short side of the virtual rectangle, and a distance to the gate valve is shorter than distances from the third target holder and the fourth target holder to the gate valve.

16 Claims, 9 Drawing Sheets

(52) U.S. Cl.
CPC ...... *H01J 37/3405* (2013.01); *H01J 37/3435* (2013.01); *H01J 37/3447* (2013.01)

(56) References Cited

U.S. PATENT DOCUMENTS

| | | | |
|---|---|---|---|
| 9,039,873 B2 | 5/2015 | Tsunekawa | |
| 2002/0064595 A1 | 5/2002 | Nomura et al. | |
| 2005/0199490 A1* | 9/2005 | Nomura | C23C 14/3464 204/298.11 |
| 2009/0139865 A1 | 6/2009 | Nomura et al. | |
| 2012/0164354 A1* | 6/2012 | Otani | C23C 14/185 427/580 |
| 2013/0277207 A1* | 10/2013 | Tsunekawa | C23C 14/34 204/192.25 |
| 2015/0001068 A1 | 1/2015 | Tsunekawa | |

FOREIGN PATENT DOCUMENTS

| | | | |
|---|---|---|---|
| JP | 11-229139 A | 8/1999 | |
| JP | 2002-167661 A | 6/2002 | |
| JP | 2009-041108 A | 2/2009 | |
| JP | WO 2012090395 A1 * | 7/2012 | ............ C23C 14/34 |
| JP | 2012-149339 A | 8/2012 | |
| KR | 10-2006-0044320 A | 5/2006 | |
| WO | 2012/090395 A1 | 7/2012 | |
| WO | WO 2014/083727 A1 | 6/2014 | |

OTHER PUBLICATIONS

International Search Report (PCT/ISA/210) dated Oct. 8, 2013, by the Japanese Patent Office as the International Searching Authority for International Application No. PCT/JP2013/004975.
Written Opinion (PCT/ISA/237) dated Oct. 8, 2013, by the Japanese Patent Office as the International Searching Authority for International Application No. PCT/JP2013/004975.
Office Action (Notice of Preliminary Rejection) dated Jul. 1, 2016, by the Korean Intellectual Property Office in corresponding Korean Patent Application 10-2015-7016991, and an English Translation of the Office Action. (9 pages).

* cited by examiner

SPUTTERING APPARATUS AND SUBSTRATE PROCESSING APPARATUS

This application is a continuation of International Patent Application No. PCT/JP2013/004975 filed on Aug. 23, 2013, and claims priority to Japanese Patent Application No. 2012-263648 filed on Nov. 30, 2012, the entire content of both of which is incorporated herein by reference.

TECHNICAL FIELD

The present invention relates to a sputtering apparatus and a substrate processing apparatus.

BACKGROUND ART

PTL 1 discloses an arrangement in which a plurality of sputtering apparatuses are arranged around a conveyance chamber. In each sputtering apparatus, four targets are arranged on the ceiling portion of a vessel forming a deposition chamber. A double rotary shutter mechanism is arranged between these targets and a substrate holder.

CITATION LIST

Patent Literature

PTL 1: Japanese Patent Laid-Open No. 2009-41108

SUMMARY OF INVENTION

Technical Problem

In order to form many films at a high throughput for the manufacture of devices, it is advantageous to use a substrate processing apparatus having a plurality of sputtering apparatuses arranged around a conveyance chamber. A plurality of sputtering apparatuses can be arranged around the conveyance chamber through a gate valve. In this case, to arrange more sputtering apparatuses around the conveyance chamber, it should decrease the width of each sputtering apparatus in a direction perpendicular to a direction in which a substrate is conveyed through a gate valve, especially the width of each sputtering apparatus on the gate valve side.

In the deposition chamber shown in FIG. 2 in PTL 1, targets 35, 36, 37, and 38 are arranged at the vertices of a virtual isosceles trapezoid. The distance between the targets 36 and 38 arranged on the gate valve 20 side is shorter than the distance between the targets 35 and 37 on the opposite side to the gate valve 20. This arrangement is advantageous in arranging many deposition chambers around the conveyance chamber.

However, the reverse surface side of each target is provided with a magnet for causing magnetron discharge. Each magnet is generally arranged such that one pole of the N and S poles is directed in the inside direction of the deposition chamber, and the other pole is directed in the outside direction of the deposition chamber. The magnetic field formed inside the deposition chamber by the magnet arranged on the reverse surface side of each target is influenced by the magnetic arranged on the reverse surface side of each adjacent target. In each deposition chamber shown in FIG. 2 in PTL 1, since the targets 35, 36, 37, and 38 are arranged at the vertices of the virtual isosceles trapezoid, the magnetic fields formed on the obverse surfaces of the respective targets can differ from each other. For example, the magnetic field formed on the obverse surface of the target 35 is influenced by the magnets for the targets 36, 37, and 38, and the magnetic field formed on the obverse surface of the target 36 is influenced by the magnets for the targets 35, 37, and 38. Since the positions of the targets 36, 37, and 38 relative to the target 35 differ from the positions of the targets 35, 37, and 38 relative to the target 36, the magnetic field formed on the obverse surface of the target 35 can differ from the magnetic field formed on the obverse surface of the target 36. Therefore, in the arrangement shown in FIG. 2 in PTL 1, sputtering characteristics can vary depending on the arrangement positions of targets to be used.

The present invention has been made upon recognition of the above problem, and has as its object to provide a sputtering apparatus which is, for example, advantageous in being arranged around a conveyance chamber and in reducing sputtering characteristic differences which can be caused depending on the positions of targets to be used.

Solution to Problem

According to the first aspect of the present invention, there is provided a sputtering apparatus which includes a chamber, a substrate holder configured to hold a substrate in the chamber and rotate about an axis perpendicular to a surface on which the substrate is held, and first to fourth target holders configured to respectively hold targets, wherein the substrate is conveyed between an internal space of the chamber and an external space of the chamber through a gate valve, comprising a shutter unit configured to select a target to be used for sputtering from four targets respectively held by the first to fourth target holders, wherein the first to fourth target holders are arranged on vertices of a virtual rectangle having long sides and short sides and inscribed in a virtual circle centered on the axis, and wherein the first target holder and the second target holder are respectively arranged on two vertices defining one short side of the virtual rectangle, and a distance from the first target holder and the second target holder to the gate valve is shorter than distances from the third target holder and the fourth target holder to the gate valve.

According to the second aspect of the present invention, there is provided a substrate processing apparatus comprising a conveyance chamber having a plurality of connection surfaces, and a sputtering apparatus connected to at least one of the plurality of connection surfaces, wherein the sputtering apparatus comprises a sputtering apparatus according to the first aspect, and an angle defined by adjacent connection surfaces of the plurality of connection surfaces is larger than 90°.

Advantageous Effects of Invention

The present invention provides a sputtering apparatus which is, for example, advantageous in being arranged around a conveyance chamber and in reducing sputtering characteristic differences which can be caused depending on the positions of targets to be used.

DESCRIPTION OF EMBODIMENTS

The present invention will be described through an exemplary embodiment with reference to the accompanying drawings.

Figure 1A:
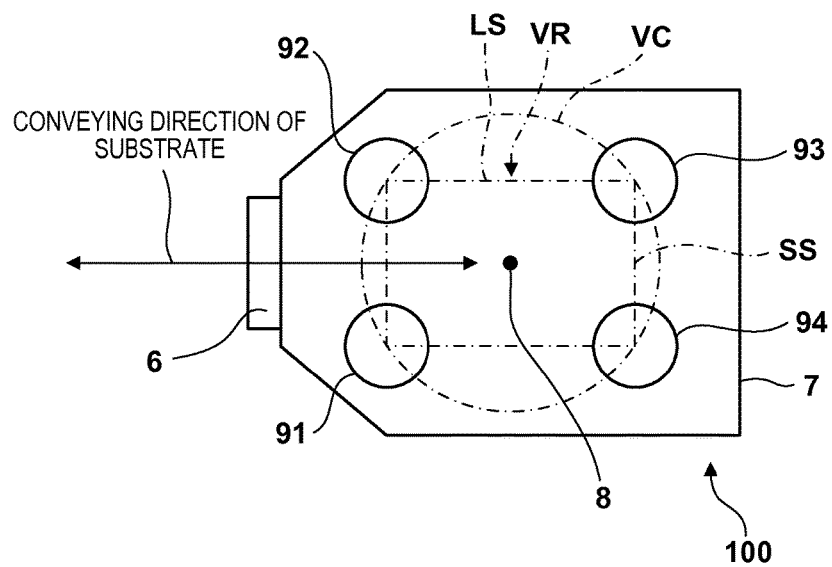
FIG. 1A is a schematic plan view of a sputtering apparatus according to one embodiment of the present invention.
Figure 1B:
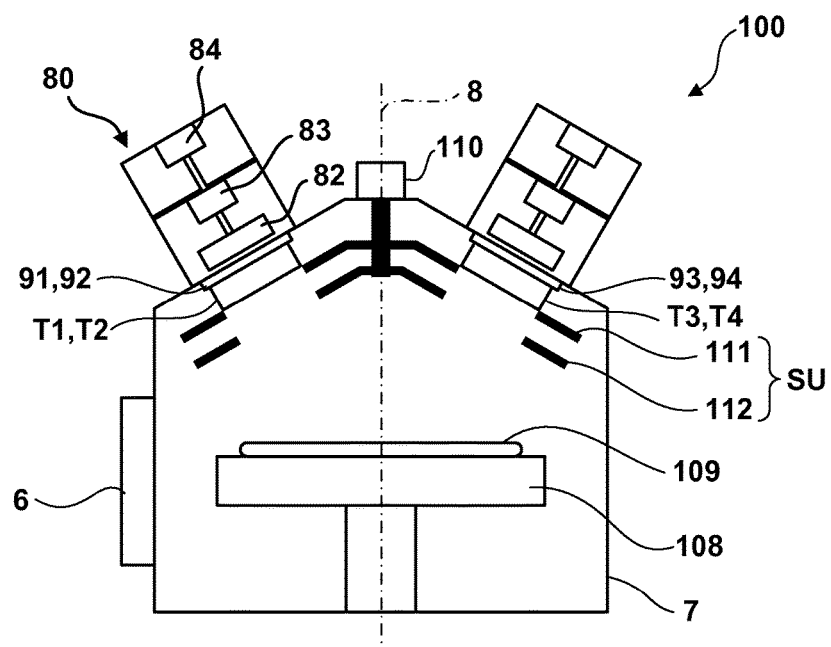
FIG. 1B is a schematic sectional view of a sputtering apparatus according to one embodiment of the present invention.

FIGS. 1A and 1B are a schematic plan view and a sectional view of a sputtering apparatus 100 according to one embodiment of the present invention. The sputtering apparatus 100 includes a chamber 7, a substrate holder 108, and first to fourth target holders 91, 92, 93, and 94. The substrate holder 108 can hold a substrate 109 in the chamber 7 and rotate about an axis 8 perpendicular to the surface of the substrate 109. The first to fourth target holders 91, 92, 93, and 94 respectively hold targets T1, T2, T3 and T4. The first to fourth target holders 91, 92, 93, and 94 are arranged along a virtual circle VC centered on the axis 8 clockwise in the order of the first target holder 91, the second target holder 92, the third target holder 93, and the fourth target holder 94. The sputtering apparatus 100 is provided with a gate valve 6, and the substrate 109 is conveyed between the internal space and the external space of the chamber 7 through the gate valve 6.

The sputtering apparatus 100 also includes a shutter unit SU for selecting a target to be used for sputtering from the four targets T1, T2, T3, and T4 respectively held by the first to fourth target holders 91, 92, 93, and 94. The shutter unit SU can include first and second shutters 111 and 112 which can rotate about the axis 8 and a driving unit 110 which individually rotates the first and second shutters 111 and 112.

The first shutter 111 and the second shutter 112 each can have at least one aperture. If the first shutter 111 and the second shutter 112 each have two apertures, it is possible to perform sputtering simultaneously using two targets (Co-sputtering).

Figure 2A:
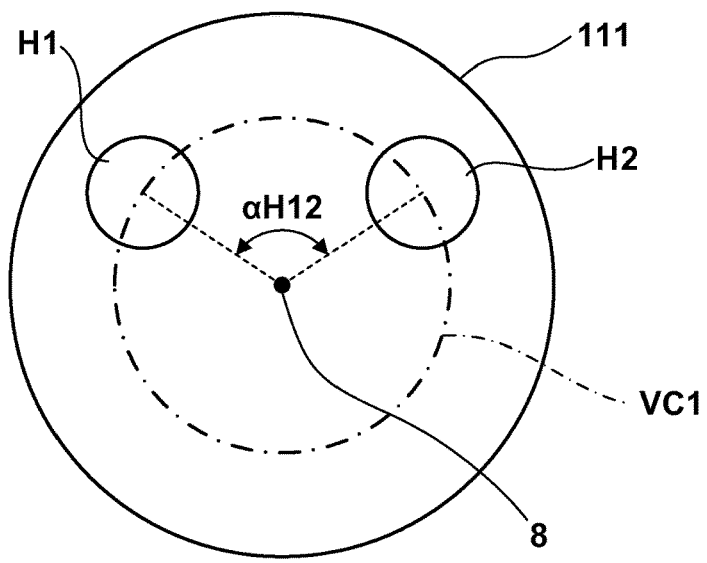
FIG. 2A is a view showing an example of the arrangement of a first shutter.
Figure 2B:
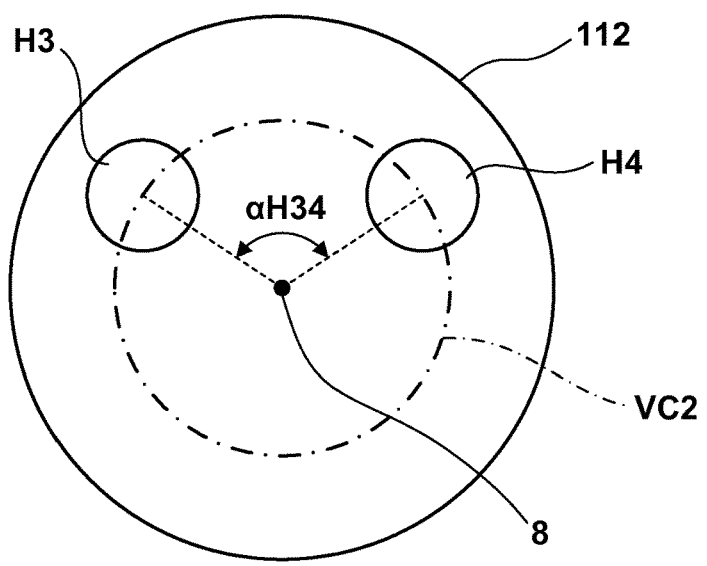
FIG. 2B is a view showing an example of the arrangement of a second shutter.

As exemplarily shown in FIG. 2A, the first shutter 111 can have two apertures H1 and H2 whose centers are arranged on one virtual circle VC1 centered on the axis 8. As exemplarily shown in FIG. 2B, the second shutter 112 can have two apertures H3 and H4 whose centers are arranged on one virtual circle VC2 centered on the axis 8. The driving unit 110 drives the first shutter 111 and the second shutter 112 such that one of the four targets T1, T2, T3, and T4 which is used for sputtering is exposed to the substrate 109 through the aperture of the first shutter 111 and the aperture of the second shutter 112. The first shutter 111 and the second shutter 112 can be arranged so as to be spaced apart from each other in a direction along the axis 8. The first shutter 111 is arranged between the first to fourth target holders 91, 92, 93, and 94 and the second shutter 112.

The central angle of an arc whose two ends respectively correspond to the centers of the two apertures H1 and H2 of the first shutter 111 is equal to the central angle of an arc whose two ends respectively correspond to the centers of adjacent target holders which can be selected from the first to fourth target holders 91, 92, 93, and 94. The central angle of an arc whose two ends respectively correspond to the centers of the two apertures H3 and H4 of the second shutter 112 is equal to the central angle of an arc whose two ends respectively correspond to the centers of adjacent target holders which can be selected from the first to fourth target holders 91, 92, 93, and 94.

In the case shown in FIG. 2A, a central angle $\alpha H12$ of an arc whose two ends respectively correspond to the centers of the two apertures H1 and H2 of the first shutter 111 is equal to the central angle of an arc whose two ends respectively correspond to the centers of the second target holder 92 and third target holder 93 (the central angle of an arc whose two ends respectively correspond to the centers of the first target holder 91 and fourth target holder 94). In the case shown in FIG. 2B, a central angle $\alpha H34$ of an arc whose two ends respectively correspond to the centers of the two apertures H3 and H4 of the second shutter 112 is equal to the central angle of an arc whose two ends respectively correspond to the centers of the second target holder 92 and third target holder 93 (the central angle of an arc whose two ends respectively correspond to the centers of the first target holder 91 and fourth target holder 94).

In place of the case shown in FIG. 2A, the central angle of an arc whose two ends respectively correspond to the centers of the two apertures H1 and H2 of the first shutter 111 may be equal to the central angle of an arc whose two ends respectively correspond to the centers of the first target holder 91 and second target holder 92 (the central angle of an arc whose two ends respectively correspond to the centers of the third target holder 93 and fourth target holder 94). In place of the case shown in FIG. 2B, the central angle of an arc whose two ends respectively correspond to the centers of the two apertures H3 and H4 of the second shutter 112 may be equal to the central angle of an arc whose two ends respectively correspond to the centers of the first target holder 91 and second target holder 92 (the central angle of an arc whose two ends respectively correspond to the centers of the third target holder 93 and fourth target holder 94).

A magnet unit 80 is arranged on the reverse surface side of each of the targets 91, 92, 93, and 94. Each magnet unit 80 can include a magnet 82 for causing magnetron discharge (for example, DC magnetron discharge) and a driving unit 83 for driving (for example, rotating) the magnet 82. Each magnet unit 80 can also include a distance adjusting unit 84 for adjusting the distance between the magnet 82 and the target holder (target).

Each of the target holders 91, 92, 93, and 94 can be configured to hold a corresponding one of the targets T1, T2, T3, and T4 in a posture in which its surface is inclined with respect to the surface of the substrate 109 held by the substrate holder 108. In this case, each of the target holders 91, 92, 93, and 94 can be configured to hold a corresponding one of the targets T1, T2, T3, and T4 such that a normal line to its surface is directed to the center of the substrate 109. In this case, each magnet unit 80 can be arranged such that its upper portion is inclined so as to separate from the axis 8.

As exemplarily shown in FIG. 9, in order to arrange many sputtering apparatuses around a conveyance chamber 300, it should decrease the size of the sputtering apparatus 100 in a direction (to be referred to as a "widthwise direction" hereinafter) perpendicular to the conveying direction of the substrate 109 between the conveyance chamber 300 and the sputtering apparatus 100. As described above, when the magnet unit 80 is inclined such that the upper portion of the magnet unit 80 is separated from the axis 8, the occupied area of the sputtering apparatus 100 can be decided by the upper portion of the magnet unit 80. In consideration of this, in order to decrease the size of the sputtering apparatus 100 in the widthwise direction, the target holders 91, 92, 93, and 94 should be arranged upon being compressed in the widthwise direction.

In this embodiment, therefore, the first to fourth target holders 91, 92, 93, and 94 (their centers) are arranged on one virtual circle VC centered on the axis 8 and also arranged at the vertices of a virtual rectangle VR having long sides LS and short sides SS and inscribed in the virtual circle VC such that the first target holder 91 and the second target holder 92 (their centers) are respectively arranged on the two vertices of the virtual rectangle VR which define one short side SS, and the distances from them to the gate valve 6 are shorter than the distances from the third target holder 93 and the fourth target holder 94 to the gate valve 6. In this case, the distances from the first target holder 91 and the second target holder 92 to the gate valve 6 are preferably equal to each other.

According to the above arrangement, the target holders 91, 92, 93, and 94 are arranged upon being compressed in the widthwise direction, thereby decreasing the size of the sputtering apparatus 100 in the widthwise direction. This makes it possible to arrange more sputtering apparatuses 100 around the conveyance chamber. In addition, according to the above arrangement, the magnetic fields formed on the surfaces of the targets T1, T2, T3, and T4 which are respectively held by the first to fourth target holders 91, 92, 93, and 94 are equal to each other. For example, the influences which the magnetic field formed on the surface of the target T1 held by the target holder 91 receives from the magnets 82 arranged on the reverse surface sides of the target T2, T3, and T4 held by the target holders 92, 93, and 94 are equivalent to those which the magnetic field formed on the surface of the target T2 held by the target holder 92 receives from the magnets 82 arranged on the reverse surface sides of the target T1, T3, and T4 held by the target holders 91, 93, and 94. That is, arranging the first to fourth target holders 91, 92, 93, and 94 (their centers) at the vertices of the virtual rectangle VR can unify the magnetic fields formed on the surfaces of the targets T1, T3, and T4. This can reduce sputtering characteristic differences which can be caused depending on the positions of the targets in use.

Control on the positional relationship between the targets T1, T2, T3, and T4, the apertures H1 and H2 of the first shutter 111, and the apertures H3 and H4 of the second shutter 112 will be exemplarily described below with reference to FIGS. 3A to 7D. The sputtering apparatuses according to this embodiment are arranged such that the respective targets are arranged while being inclined toward a substrate. For the sake of descriptive convenience, however, FIGS. 3A to 7D show that the targets T1, T2, T3, and T4, the apertures H1 and H2 of the first shutter 111, and the apertures H3 and H4 of the second shutter 112 are parallel to each other. FIGS. 7A to 7D are sectional views of the targets T1, T2, T3, and T4, the apertures H1 and H2 of the first shutter 111, and the apertures H3 and H4 of the second shutter 112 along the above virtual circle. The controller shown in FIG. 10 can perform control on the positional relationship exemplarily shown in FIGS. 3A to 7D.

Referring to FIGS. 3A to 7D, each target indicated by the hatching is the one that is used for sputtering, and each target indicated by the outline solid line or outline dotted line is the one that is not used for sputtering. In addition, each target indicated by the outline solid line is the one that is located at the same position as that of the aperture of the first shutter 111 or the aperture of the second shutter 112. Each target indicated by the outline dotted line is the one that is located at a position different from either that of the aperture of the first shutter 111 or that of the aperture of the second shutter 112.

Figure 3A:
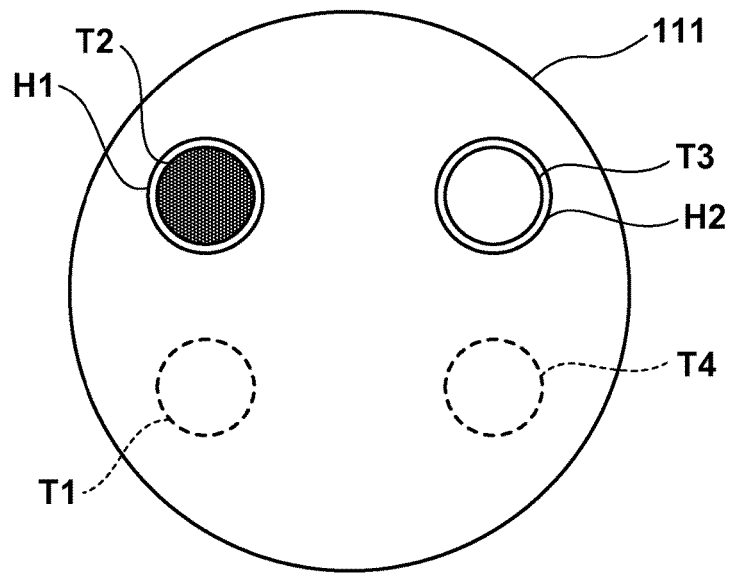
FIG. 3A is a view exemplarily showing control on the positional relationship between targets and the apertures of the first and second shutters.
Figure 3B:
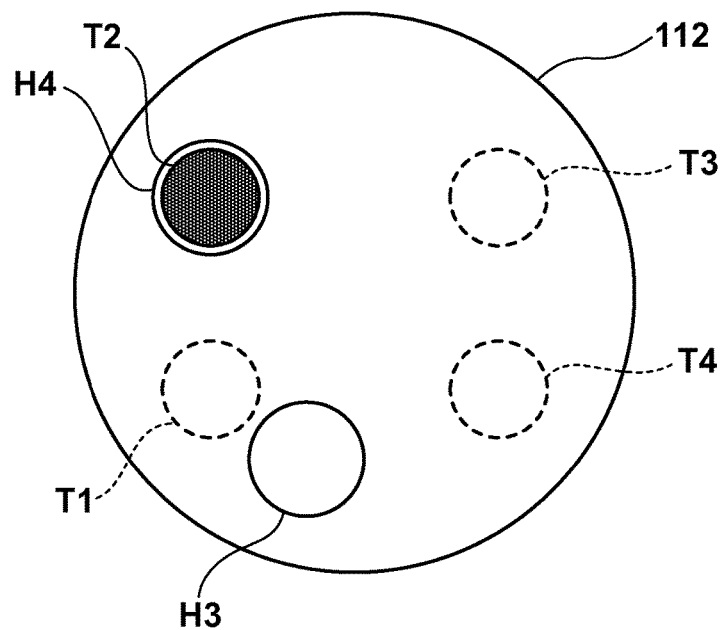
FIG. 3B is a view exemplarily showing control on the positional relationship between the targets and the apertures of the first and second shutters.
Figure 4A:
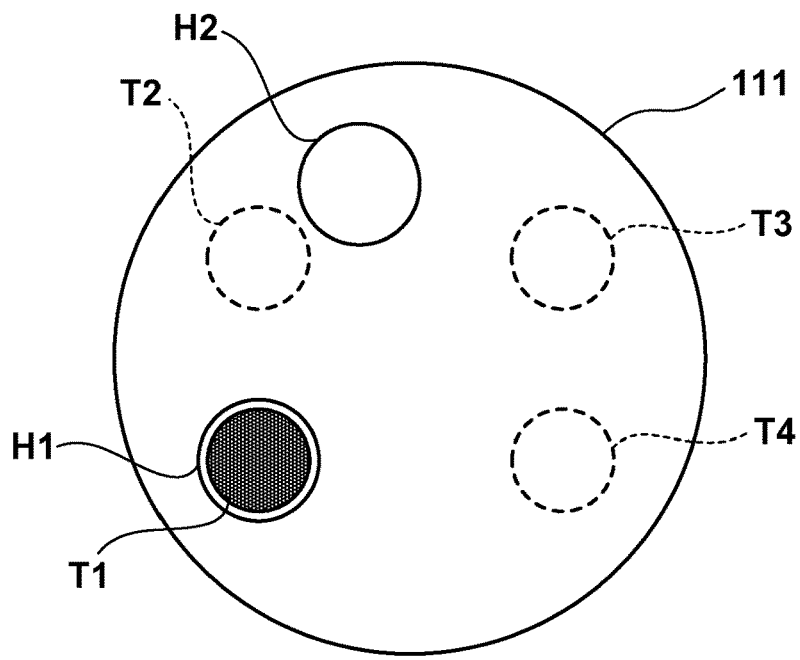
FIG. 4A is a view exemplarily showing control on the positional relationship between the targets and the apertures of the first and second shutters.
Figure 4B:
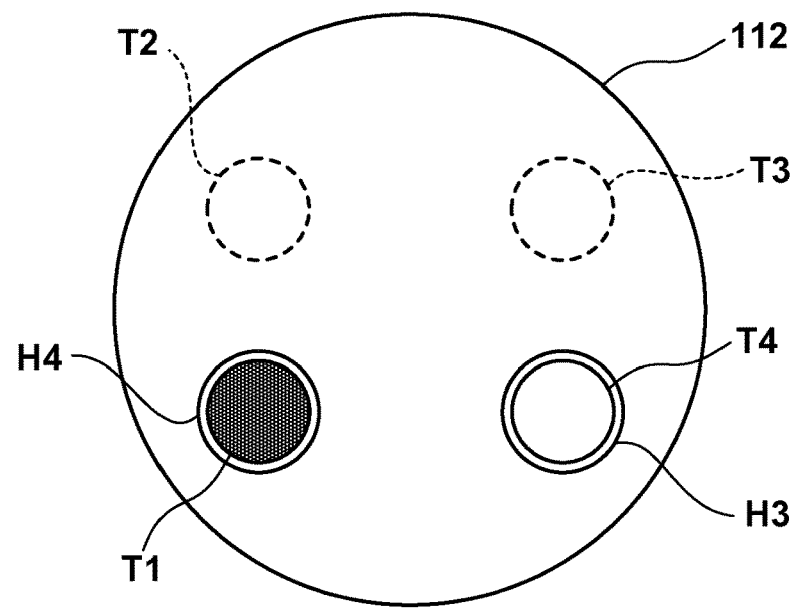
FIG. 4B is a view exemplarily showing control on the positional relationship between the targets and the apertures of the first and second shutters.
Figure 7A:
FIG. 7A is a view exemplarily showing control on the positional relationship between the targets and the apertures of the first and second shutters.
Figure 7B:
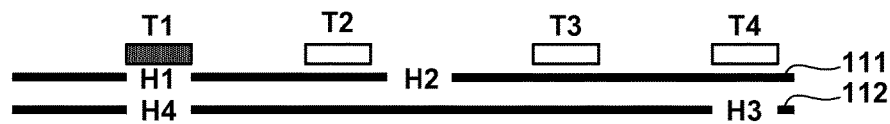
FIG. 7B is a view exemplarily showing control on the positional relationship between the targets and the apertures of the first and second shutters.

FIGS. 3A, 3B, and 7A exemplarily show a state in which the target T2 is used for sputtering. FIGS. 4A, 4B, and 7B exemplarily show a state in which the target T1 is used for sputtering. In the case shown in FIGS. 3A, 3B, and 7A, since the aperture H2 of the first shutter 111 faces the target T3 which is not used for sputtering, the material emitted from the target T2 used for sputtering adheres to the target T3. This can contaminate the target T3. In contrast to this, in the case shown in FIGS. 4A, 4B, and 7B, since the aperture H2 of the first shutter 111 does not face the target T3 which is not used for sputtering, the material emitted from the target T2 used for sputtering does not easily adhere to the target T3. This reduces the possibility of contaminating the target T3. In this case, in the case shown in FIGS. 4A, 4B, and 7B, when only one target T1 of the four targets T1, T2, T3, and T4 is used for sputtering, control is performed to make one of the two apertures H1 and H2 of the first shutter 111 face the target T1 while making the other aperture face none of the four targets T1, T2, T3, and T4. In addition, in the case shown in FIGS. 4A, 4B, and 7B, since the interval between the targets T1 and T2 is larger than that between the apertures H1 and H2, the possibility of contaminating the target T3 is lower than otherwise.

Figure 5A:
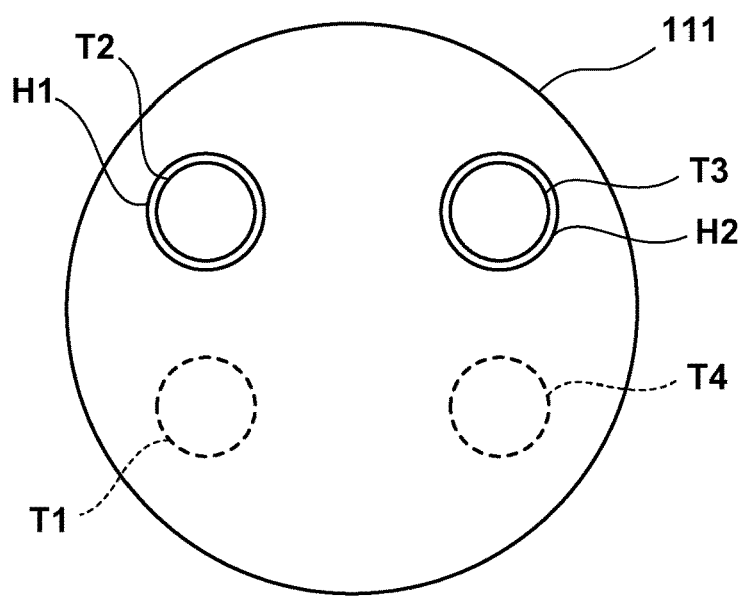
FIG. 5A is a view exemplarily showing control on the positional relationship between the targets and the apertures of the first and second shutters.
Figure 5B:
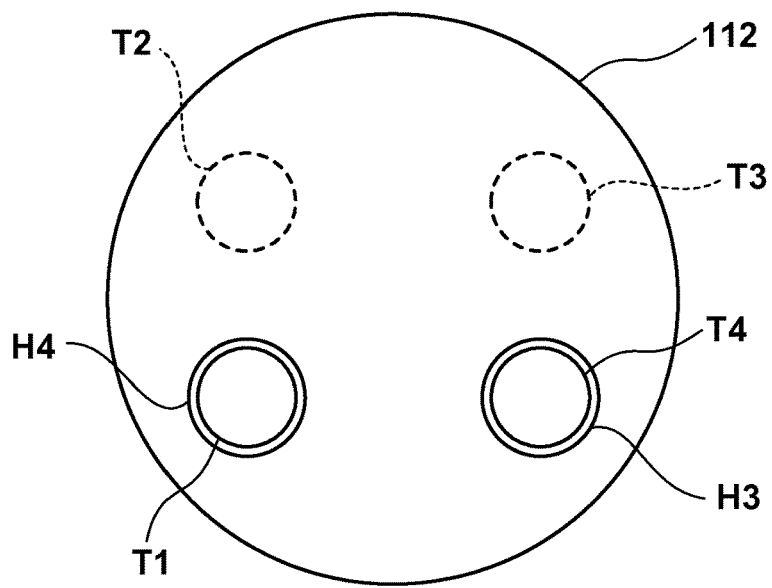
FIG. 5B is a view exemplarily showing control on the positional relationship between the targets and the apertures of the first and second shutters.
Figure 6A:
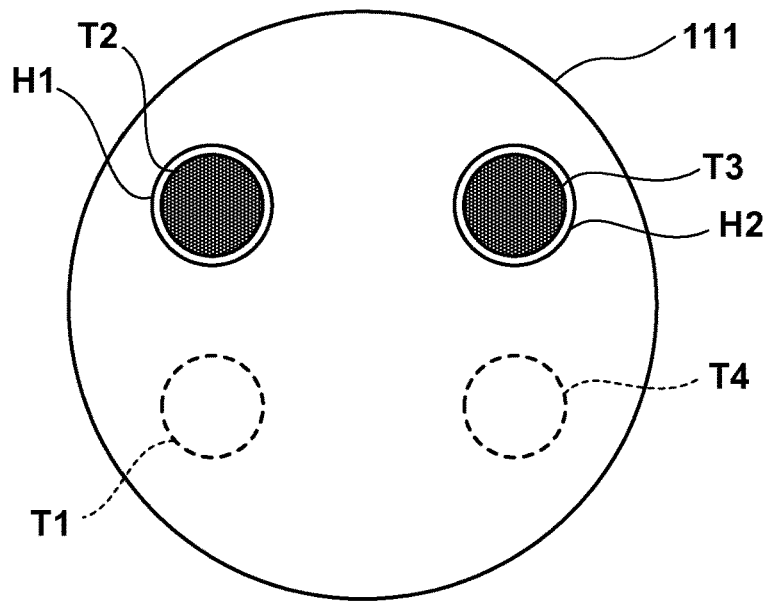
FIG. 6A is a view exemplarily showing control on the positional relationship between the targets and the apertures of the first and second shutters.
Figure 6B:
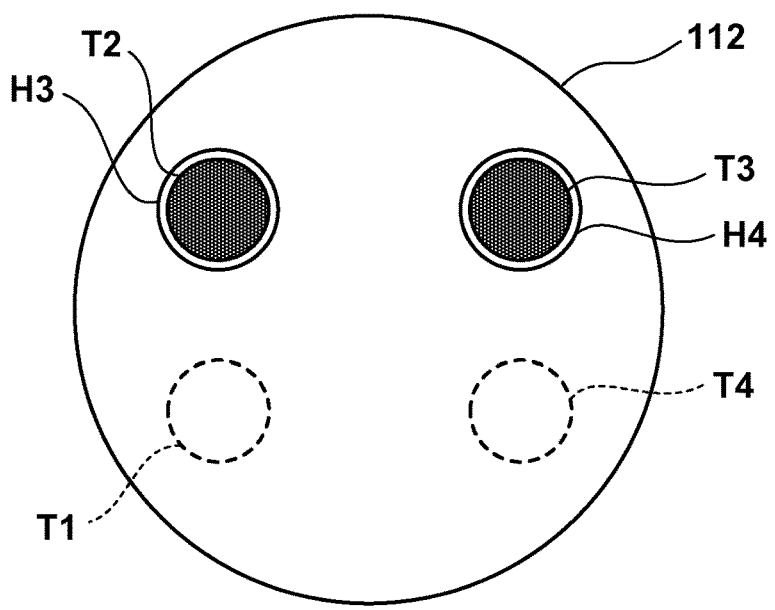
FIG. 6B is a view exemplarily showing control on the positional relationship between the targets and the apertures of the first and second shutters.
Figure 7C:
FIG. 7C is a view exemplarily showing control on the positional relationship between the targets and the apertures of the first and second shutters.
Figure 7D:
FIG. 7D is a view exemplarily showing control on the positional relationship between the targets and the apertures of the first and second shutters.

FIGS. 5A, 5B, and 7C exemplarily show a case in which none of the targets T1, T2, T3, and T4 are used for sputtering. FIGS. 6A, 6B, and 7D exemplarily show a case in which the targets T2 and T3 of the targets T1, T2, T3, and T4 are simultaneously used for sputtering (that is, sputtering is simultaneously performed).

Figure 8:
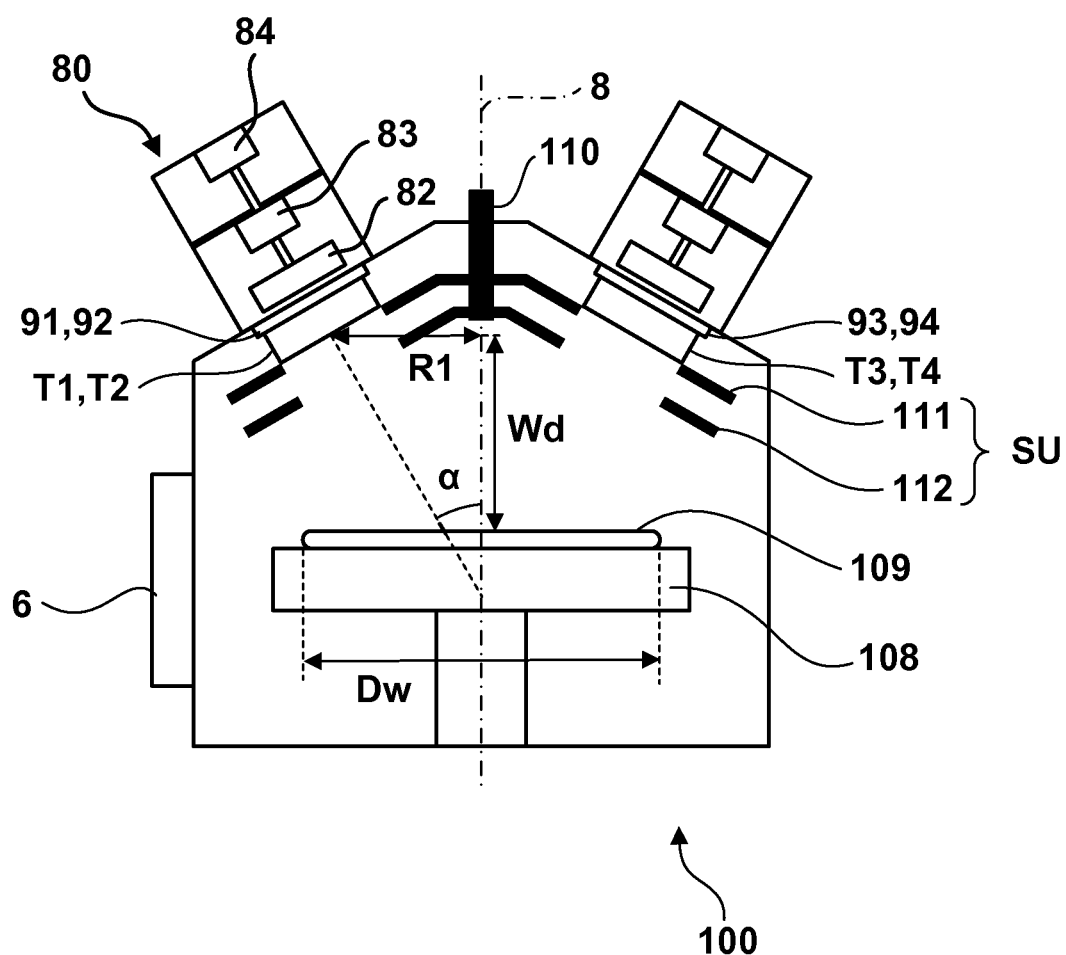
FIG. 8 is a schematic sectional view of the sputtering apparatus according to one embodiment of the present invention.

Although an embodiment associated with the structure of the sputtering apparatus 100 will be described below with reference to FIG. 8, the technical scope of the present invention is not limited to this embodiment. According to one embodiment, a distance R1 between each of the centers of the targets T1, T2, T3, and T4 and the axis 8 is 240 mm, a distance (a distance along the axis 8) Wd between each of the centers of the targets T1, T2, T3, and T4 and the surface of the substrate 109 is 250 mm, an angle α defined by a normal line from each of the centers of the targets T1, T2, T3, and T4 and the axis 8 is 35°, and a diameter Dw of the substrate 109 is 300 mm. In this embodiment, σ (standard deviation) of the thickness distribution of the film formed on the substrate 109 by sputtering was equal to or less than 2%.

Figure 9:
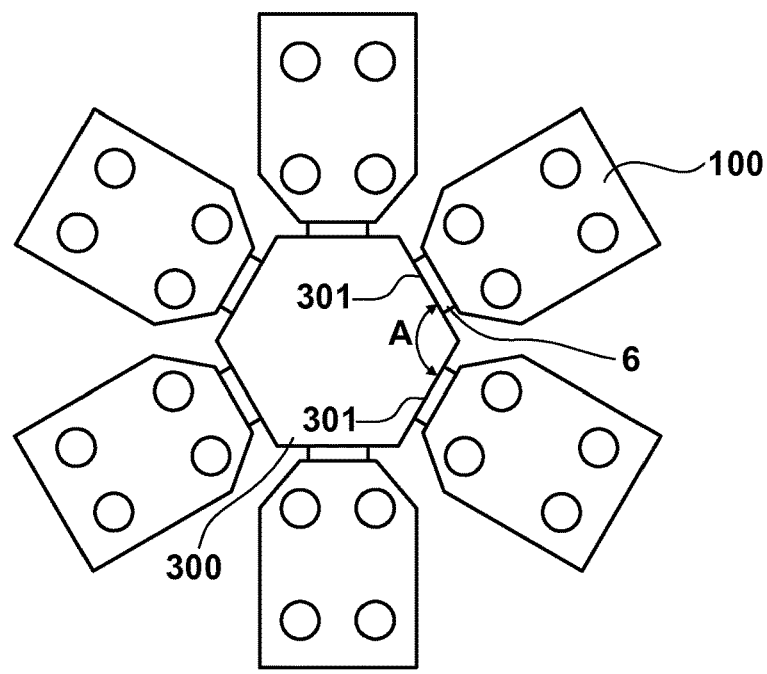
FIG. 9 is a sectional view of a substrate processing apparatus according to one embodiment of the present invention.

FIG. 9 exemplarily shows a substrate processing apparatus including one or a plurality of sputtering apparatuses 100 arranged around the conveyance chamber 300. The conveyance chamber 300 has a plurality of connection surfaces 301. The sputtering apparatus 100 is connected to at least one of the plurality of connection surfaces 301. The conveyance chamber 300 and the sputtering apparatus 100 are connected to each other through the gate valve 6. An angle A defined by the adjacent connection surfaces 301 of the plurality of connection surfaces 301 is preferably larger than 90°. This makes it possible to arrange more sputtering apparatuses 100 around the conveyance chamber 300.

Figure 10:
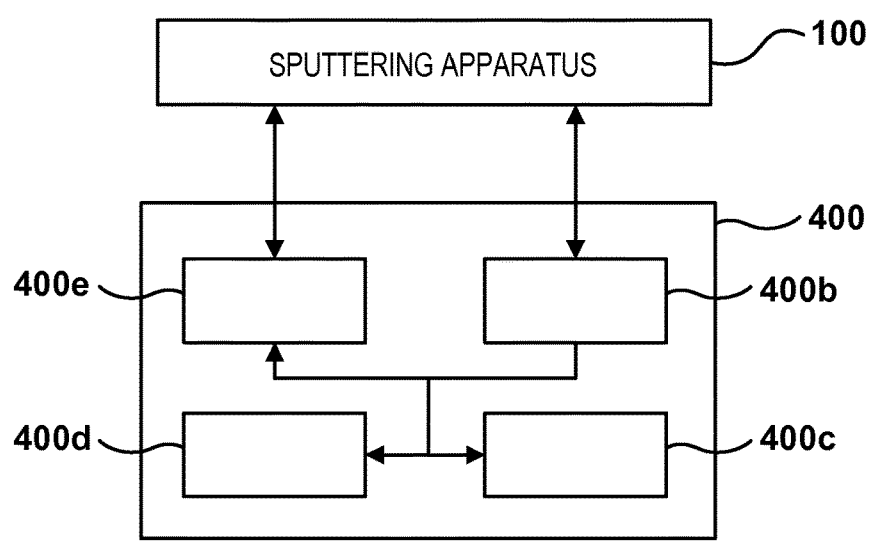
FIG. 10 is a block diagram for explaining a controller provided in the substrate processing apparatus according to one embodiment of the present invention.

FIG. 10 shows the arrangement of a controller 300 according to this embodiment. The controller 400 includes an input unit 400b, a storage unit 400c storing programs and data, a processor 400d, and an output unit 400e, and can control the sputtering apparatus 100 according to the embodiment. The controller 400 can control the operation of the sputtering apparatus 100 by causing the processor 400d to read out and execute control programs stored in the storage unit 400c. That is, the driving unit 110 is operated under the control of the controller 400 to operate the first shutter 111 and the second shutter 112 shown in FIGS. 3A to 7D. Note that the controller 400 may be provided separately from the sputtering apparatus 100 or incorporated in the sputtering apparatus 100. In addition, the controller 400 is connected to a power supply which controls power to be applied to the targets T1, T2, T3, and T4 (that is, power to be applied to the target holders 91, 92, 93, and 94) and can control the driving unit 110 in accordance with the supply of power to each target.

The invention claimed is:

1. A substrate processing apparatus comprising:
a conveyance chamber having a plurality of connection surfaces, an angle defined by adjacent connection surfaces of the plurality of connection surfaces being larger than 90° ; and
a sputtering apparatus connected to one of the plurality of connection surfaces via a gate valve, the sputtering apparatus comprising:
a sputtering chamber,
a substrate holder configured to hold a substrate in the sputtering chamber and rotate about an axis perpendicular to a surface on which the substrate is held, the substrate being conveyed along a conveying direction between an internal space of the conveyance chamber and an internal space of the sputtering chamber, and
first to fourth target holders configured to respectively hold targets, and not including any other target holders, and each of the first to fourth target holders is configured to hold a target in a posture in which a surface of the target is inclined with respect to a surface of the substrate held by the substrate holder,
a shutter unit configured to select a target to be used for sputtering from four targets respectively held by the first to fourth target holders,
wherein the first to fourth target holders are arranged, in a plan view, on vertices of a virtual rectangle having long sides and short sides and inscribed in a virtual circle centered on the axis such that the first to fourth target holders and the four targets are arranged within the sputtering chamber in the plan view,
wherein the first target holder and the second target holder are respectively arranged on two vertices defining one short side of the virtual rectangle in a width-wise direction of the sputtering chamber, which is perpendicular to the conveying direction, and distances from the first target holder and the second target holder to the gate valve are shorter than distances from the third target holder and the fourth target holder to the gate valve, a distance between a center of the first target holder and the gate valve in the conveying direction being smaller than a distance between the first target holder and the fourth target holder in the conveying direction, and
first to fourth magnet units arranged on the sputtering chamber, in respective association with the first to fourth target holders, wherein a part of each of the first to fourth magnet units is arranged outside the sputtering chamber in plan view, such that a distance between the parts of the first and second magnet units is longer than the width of the sputtering chamber.

2. The substrate processing apparatus according to claim 1, wherein distances from the first target holder and the second target holder to the gate valve are equal to each other.

3. The substrate processing apparatus according to claim 1, wherein the first to fourth target holders are sequentially arranged along the virtual circle in an order of the first target holder, the second target holder, the third target holder, and the fourth target holder,
the shutter unit includes a first shutter and a second shutter which are configured to rotate about the axis,
the first shutter and the second shutter are arranged to be spaced apart from each other in a direction along the axis,
the first shutter has two apertures arranged on one virtual circle centered on the axis and the second shutter has two apertures arranged on one virtual circle centered on the axis, and
a central angle of an arc having two ends respectively corresponding to centers of the two apertures of the first shutter is equal to a central angle of an arc having two ends respectively corresponding to centers of adjacent target holders selectable from the first to fourth target holders, and a central angle of an arc having two ends respectively corresponding to centers of the two apertures of the second shutter is equal to a central angle of an arc having two ends respectively corresponding to centers of adjacent target holders selectable from the first to fourth target holders.

4. The substrate processing apparatus according to claim 3, wherein the central angle of an arc having two ends respectively corresponding to centers of the two apertures of the first shutter is equal to a central angle of an arc having two ends respectively corresponding to centers of the second target holder and the third target holder, and the central angle of an arc having two ends respectively corresponding to centers of the two apertures of the second shutter is equal to the central angle of the arc having two ends respectively corresponding to the centers of the second target holder and the third target holder.

5. The substrate processing apparatus according to claim 3, wherein the central angle of the arc having two ends respectively corresponding to the centers of the two apertures of the first shutter is equal to a central angle of an arc having two ends respectively corresponding to centers of the first target holder and the second target holder, and the central angle of the arc having two ends respectively corresponding to the centers of the two apertures of the second shutter is equal to a central angle of an arc having two ends respectively corresponding to centers of the first target holder and the second target holder.

6. The substrate processing apparatus according to claim 3, wherein the first shutter is arranged between the first to fourth target holders and the second shutter, and when only one target of the four targets is used for sputtering, the first shutter is controlled such that one of the two apertures of the first shutter faces the one target, and the other aperture faces none of the four targets.

7. The substrate processing apparatus according to claim 1, wherein the sputtering chamber includes a shape that is tapered inwardly at an end adjacent the conveyance chamber such that the chamber is narrower at the end adjacent the conveyance chamber.

8. The substrate processing apparatus according to claim 1, wherein a width of the sputtering chamber in the width-wise direction becomes narrower toward the gate valve beginning at a position on a line which passes through a center of the first target holder and a center of the second target holder and parallel to the width-wise direction.

9. The substrate processing apparatus according to claim 1, wherein the shutter unit includes a first shutter and a second shutter which are configured to rotate about the axis, the first shutter being arranged between the second shutter and the first to fourth target holders, the first shutter having first and second apertures, the second shutter having third and fourth apertures, and wherein when sputtering is to be performed by using only the target held by the second target holder, the first shutter is controlled such that the first aperture is arranged in front of the target held by the second target holder and the second aperture is arranged in front of the target held by the third target holder, and the second shutter is controlled such that the fourth aperture is arranged in front of the target held by the second target holder and the third aperture is arranged at a position shifted from each of front surfaces of the targets held by the first to fourth target holders.

10. The substrate processing apparatus according to claim 1, wherein the shutter unit includes a first shutter and a second shutter which are configured to rotate about the axis, the first shutter being arranged between the second shutter and the first to fourth target holders, the first shutter having first and second apertures, the second shutter having third and fourth apertures, and wherein when sputtering is to be performed by using only the target held by the second target holder, the first shutter is controlled such that the first aperture is arranged in front of the target held by the first target holder and the second aperture is arranged at a position shifted from each of front surfaces of the targets held by the first to fourth target holders, and the second shutter is controlled such that the fourth aperture is arranged in front of the target held by the first target holder and the third aperture is arranged in front of the target held by the fourth target holder.

11. A substrate processing apparatus comprising:
a conveyance chamber having a plurality of connection surfaces; and
a sputtering apparatus connected to one of the plurality of connection surfaces via a gate valve, the sputtering apparatus comprising:
a sputtering chamber,
a substrate holder configured to hold a substrate in the sputtering chamber, the substrate being conveyed along a conveying direction between an internal space of the conveyance chamber and an internal space of the sputtering chamber, and
first to fourth target holders configured to respectively hold targets, and not including any other target holders,
a shutter unit configured to select a target to be used for sputtering from four targets respectively held by the first to fourth target holders,
wherein the first to fourth target holders are arranged, in a plan view, on vertices of a virtual rectangle having long sides and short sides and inscribed in a virtual circle centered on the axis such that the first to fourth target holders and the four targets are arranged within the sputtering chamber in the plan view,
wherein the first target holder and the second target holder are respectively arranged on two vertices defining one short side of the virtual rectangle in a width-wise direction of the sputtering chamber, which is perpendicular to the conveying direction, and distances from the first target holder and the second target holder to the gate valve are shorter than distances from the third target holder and the fourth target holder to the gate valve, a distance between a center of the first target holder and the gate valve in the conveying direction being smaller than a distance between the first target holder and the fourth target holder in the conveying direction.

12. The substrate processing apparatus according to claim 11, wherein a width of the sputtering chamber in the width-wise direction becomes narrower toward the gate valve beginning at a position on a line which passes through a center of the first target holder and a center of the second target holder and parallel to the width-wise direction.

13. The substrate processing apparatus according to claim 11, wherein the shutter unit includes a first shutter and a second shutter which are configured to rotate about the axis, the first shutter being arranged between the second shutter and the first to fourth target holders, the first shutter having first and second apertures, the second shutter having third and fourth apertures, and wherein when sputtering is to be performed by using only the target held by the second target holder, the first shutter is controlled such that the first aperture is arranged in front of the target held by the second target holder and the second aperture is arranged in front of the target held by the third target holder, and the second shutter is controlled such that the fourth aperture is arranged in front of the target held by the second target holder and the third aperture is arranged at a position shifted from each of front surfaces of the targets held by the first to fourth target holders.

14. The substrate processing apparatus according to claim 11, wherein the shutter unit includes a first shutter and a second shutter which are configured to rotate about the axis, the first shutter being arranged between the second shutter and the first to fourth target holders, the first shutter having first and second apertures, the second shutter having third and fourth apertures, and wherein when sputtering is to be performed by using only the target held by the second target holder, the first shutter is controlled such that the first aperture is arranged in front of the target held by the first target holder and the second aperture is arranged at a position shifted from each of front surfaces of the targets held by the first to fourth target holders, and the second shutter is controlled such that the fourth aperture is arranged in front of the target held by the first target holder and the third aperture is arranged in front of the target held by the fourth target holder.

15. The substrate processing apparatus according to claim 1, wherein the sputtering chamber has a first side and a second side which is an opposite side of the first side, the gate valve being arranged at the first side, and wherein a distance between a center of the fourth target holder and the second side of the sputtering chamber in the conveying direction is smaller than the distance between the first target holder and the fourth target holder in the conveying direction.

16. The substrate processing apparatus according to claim 11, wherein the sputtering chamber has a first side and a second side which is an opposite side of the first side, the gate valve being arranged at the first side, and wherein a distance between a center of the fourth target holder and the second side of the sputtering chamber in the conveying direction is smaller than the distance between the first target holder and the fourth target holder in the conveying direction.

\* \* \* \* \*